United States Patent [19]

Arvidson et al.

[11] Patent Number: 5,118,485
[45] Date of Patent: Jun. 2, 1992

[54] RECOVERY OF LOWER-BOILING SILANES IN A CVD PROCESS

[75] Inventors: Arvid N. Arvidson; David J. Pasek, both of Midland, Mich.

[73] Assignee: Hemlock Semiconductor Corporation, Hemlock, Mich.

[21] Appl. No.: 173,690

[22] Filed: Mar. 25, 1988

[51] Int. Cl.$^5$ .................... C01B 33/08; C01B 33/107
[52] U.S. Cl. ................... 423/342; 423/348; 423/349; 427/248.1; 427/255.1
[58] Field of Search ............... 423/342, 348, 349, 350; 427/248.1, 255.1; 148/DIG. 27; 437/81, 99, 103, 233

[56] References Cited

U.S. PATENT DOCUMENTS

| | | | |
|---|---|---|---|
| 3,011,877 | 12/1961 | Schweickert et al. | 23/284 |
| 3,099,534 | 7/1963 | Schweickert et al. | 23/208 |
| 3,147,071 | 9/1964 | Jenkner | 23/14 |
| 3,147,141 | 9/1964 | Ishizuka | 118/49.1 |
| 4,113,845 | 9/1978 | Litteral | 423/342 |
| 4,150,168 | 4/1979 | Yatsurugi et al. | 427/51 |
| 4,179,530 | 12/1979 | Koppel et al. | 427/51 |
| 4,311,545 | 1/1982 | Bugl et al. | 156/613 |
| 4,610,858 | 9/1986 | Yamada et al. | 423/342 |
| 4,613,489 | 9/1986 | Morimoto | 423/342 |
| 4,751,067 | 6/1988 | Levin | 423/349 |

FOREIGN PATENT DOCUMENTS

| | | | |
|---|---|---|---|
| 1184017 | 3/1985 | Canada | 423/347 |
| 41-10326 | 6/1966 | Japan | 423/342 |
| 755753 | 8/1956 | United Kingdom | 423/342 |

Primary Examiner—Robert Kunemund
Assistant Examiner—Ken Horton
Attorney, Agent, or Firm—William F. Boley; Carl A. Yorimoto

[57] ABSTRACT

A process for the deposition of pure semiconductor silicon by reductive chemical vapor decomposition of a precursor silane, the process comprising: (1) forming and depositing semiconductor silicon on a heated substrate; (2) separating a mixture enriched in lower-boiling silanes from the effluent gases from the decomposition/deposition reactor; (3) combining the mixture enriched in lower-boiling silanes with additional tetrachlorosilane, so that there is present in the combination less than about 1.0 mole hydrogen bonded to silicon per mole of total silicon; (4) passing the combination through a bed of a solid disproportionation catalyst to facilitate disproportionation of hydrogen-containing silanes and chlorine-containing silanes to produce a stream that is reduced in content of silane, chlorosilane, and dichlorosilane and increased in content of trichlorosilane; and (5) isolating and separating the trichlorosilane.

24 Claims, 2 Drawing Sheets 5,118,485

RECOVERY OF LOWER-BOILING SILANES IN A CVD PROCESS

BACKGROUND OF THE INVENTION

This invention relates to a process for the preparation of semiconductor-grade silicon in which losses of lower-boiling silanes are reduced. More specifically, this invention relates to a process in which these lower-boiling silanes are disproportionated with excess tetrachlorosilane to generate trichlorosilane for easier recovery and containment.

For the purposes of the instant invention, the term "silanes" is used generically to encompass specific compounds including silane ($SiH_4$), chlorosilane ($H_3SiCl$ or MCS), dichlorosilane ($H_2SiCl_2$ or DCS), trichlorosilane ($HSiCl_3$ or TCS), and tetrachlorosilane ($SiCl_4$ or STC). The "lower-boiling silanes" are defined in the instant invention as $SiH_4$, MCS, and DCS. The term "silane" followed by the chemical formula ($SiH_4$) will be used to designate silane as a specific compound.

$SiH_4$, MCS, and DCS have boiling points at atmospheric pressure of $-112°$ C., $-31°$ C., and $8°$ C., respectively. These silanes are difficult to contain due to their low-boiling points. Superatmospheric pressures and low temperatures are necessary for the recovery and storage of these materials. Losses of these materials during processing or in storage is a significant economic and environmental concern.

The preparation of semiconductor silicon via reductive chemical vapor decomposition/deposition (CVD) is known in the art. Representative examples of the apparatus and method are described in several U.S. patents: U.S. Pat. No. 3,011,877, Schweickert et al., issued Dec. 5, 1961; U.S. Pat. No. 3,099,534, Schweickert et al., issued Jul. 30, 1963; U.S. Pat. No. 3,147,141, Ishizuka, issued Sep. 1, 1964; U.S. Pat. No. 4,150,168, Yatsurugi et al., issued Apr. 17, 1979; U.S. Pat. No. 4,179,530, Koppl et al., issued Dec. 18, 1979; and U.S. Pat. No. 4,311,545, Bugl et al., issued Jan. 19, 1982.

The chemistry of the disproportionation of silicon-containing materials having hydrogen and chlorine ligands is known in the art. The use of solid catalysts or catalysts on a solid support is also known in the art. Jenkner et al., U.S. Pat. No. 3,147,071, issued Sep. 1, 1964, discloses a process for manufacturing dichlorosilane from reaction mixtures such as silane and tetrachlorosilane using activated carbon as a catalyst.

Litteral et al., U.S. Pat. No. 4,113,845, issued Sep. 12, 1978, discloses a process in which dichlorosilane can be prepared from trichlorosilane and silane can be prepared from dichlorosilane. This process utilizes a catalyst which is an ion exchange resin to which is bonded tertiary amino or quaternary ammonium groups.

SUMMARY OF THE INVENTION

The objective of the instant invention is minimizing the loss of lower-boiling silanes from the CVD process for preparing semiconductor-grade silicon. A further objective of the instant invention is the recovery and reuse of the resultant TCS as a feed to the CVD process or as a feed for a process for preparing $SiH_4$, MCS, or DCS, also suitable as feeds for a CVD process.

Lower-boiling silanes are contained by superatmospheric pressure and/or low temperatures. $SiH_4$ is normally contained as a pressurized gas. MCS and DCS can be maintained as liquified gases. Recovery of these lower-boiling silanes from vapor streams in which the silanes are diluted with non-condensible gases such as hydrogen and nitrogen is achieved with great difficulty and cost because of the need for superatmospheric pressures and, in most cases, extremely low temperatures to effect liquification and subsequent isolation and separation. Conversion of these lower-boiling silanes to the less volatile TCS in the process stream before isolation and separation facilitates recovery in a more efficient, less costly manner than the state of the art of compression and cooling.

The chemistry of disproportionation of hydrogen-containing silanes and chlorine-containing silanes is known in the art. Further, the preparation of pure semiconductor silicon via the CVD process is also known in the art. However, nowhere in the art is there a demonstration or suggestion of the use of a CVD process for the preparation of pure semiconductor silicon utilizing a bed of a solid disproportionation catalyst as a means for recovering lower-boiling silanes, that are presently lost, by disproportionating these lower-boiling silanes to more readily contained TCS.

BRIEF DESCRIPTION OF THE DRAWING

The instant invention will become better understood by those skilled in the art from a consideration of the attached drawings.

Figure 1:
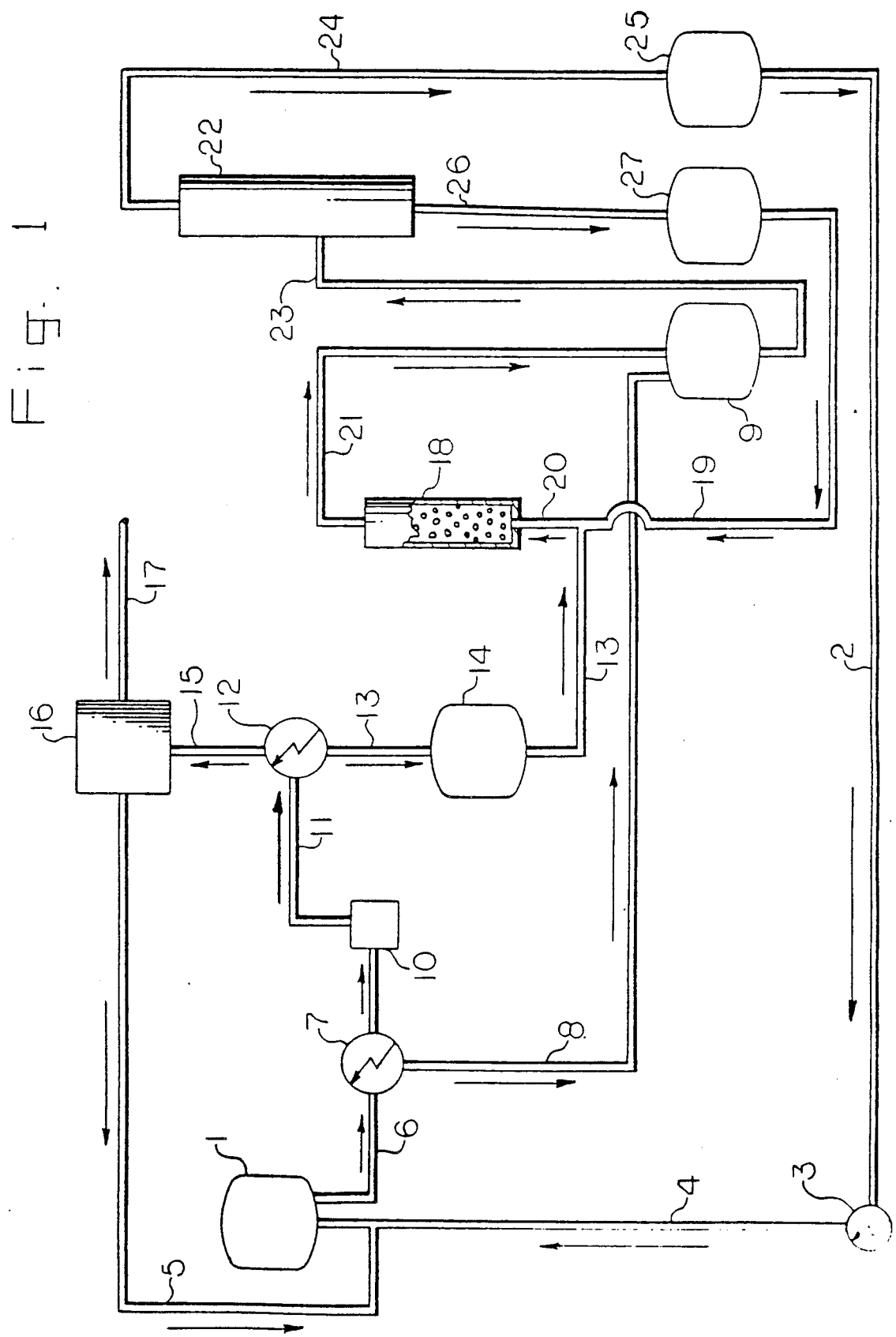
FIG. 1 is a schematic representation of one embodiment of the instant invention in which a CVD process for the preparation of semiconductor-grade silicon generates a liquid stream, containing significant quantities of lower-boiling silanes. This liquid is mixed with excess STC and contacted with a solid catalyst to convert lower-boiling silanes to TCS.

The presentation of these two embodiments of the instant invention is for illustrative purposes and is not to be construed as limiting the instant invention as delineated in the claims.

DESCRIPTION OF THE DRAWING

In FIG. 1, 1 is a CVD reactor, including an electrically heated semiconductor-grade silicon substrate. 2 is a TCS liquid feed stream. 3 is a vaporizer. 4 is the vapor TCS feed stream to the CVD reactor. 5 is the hydrogen gas feed stream to the CVD reactor. 6 is the vapor effluent stream from the CVD reactor 1 which comprises unreacted TCS, hydrogen, by-product silanes, and by-product hydrogen chloride. 7 is a cooling/condensation system for recovering silanes from the CVD reactor effluent 6. 8 is a recovered liquid stream, containing primarily TCS and STC from recovery system 7. 9 is a tank for holding a liquid comprising mainly TCS and STC. 10 is a gas compressor. 11 is a vapor stream enriched in MCS and DCS content. 12 is a refrigerated condenser. 13 is a liquid stream with significant content of MCS and DCS. 14 is a tank for holding liquid stream 13. 15 is a vapor stream comprising hydrogen and hydrogen chloride. 16 is an activated carbon system for effecting separation of hydrogen from hydrogen chloride. 17 is an enriched hydrogen chloride stream. 18 is the disproportionation reactor which is a bed of a solid catalyst. 19 is a liquid STC stream. 20 is the combination of the silane stream 13 and STC stream 19 fed to the disproportionation reactor 18. 21 is the liquid effluent stream from reactor 18, reduced in content of MCS and DCS and enriched in TCS content. 22 is a distillation column. 23 is a stream which is primarily TCS and STC and is the feed to distillation column 22. 24 is a stream of recovered TCS. 25 is a TCS holding tank. 26 is a stream of recovered STC. 27 is a tank for holding liquid STC.

Figure 2:
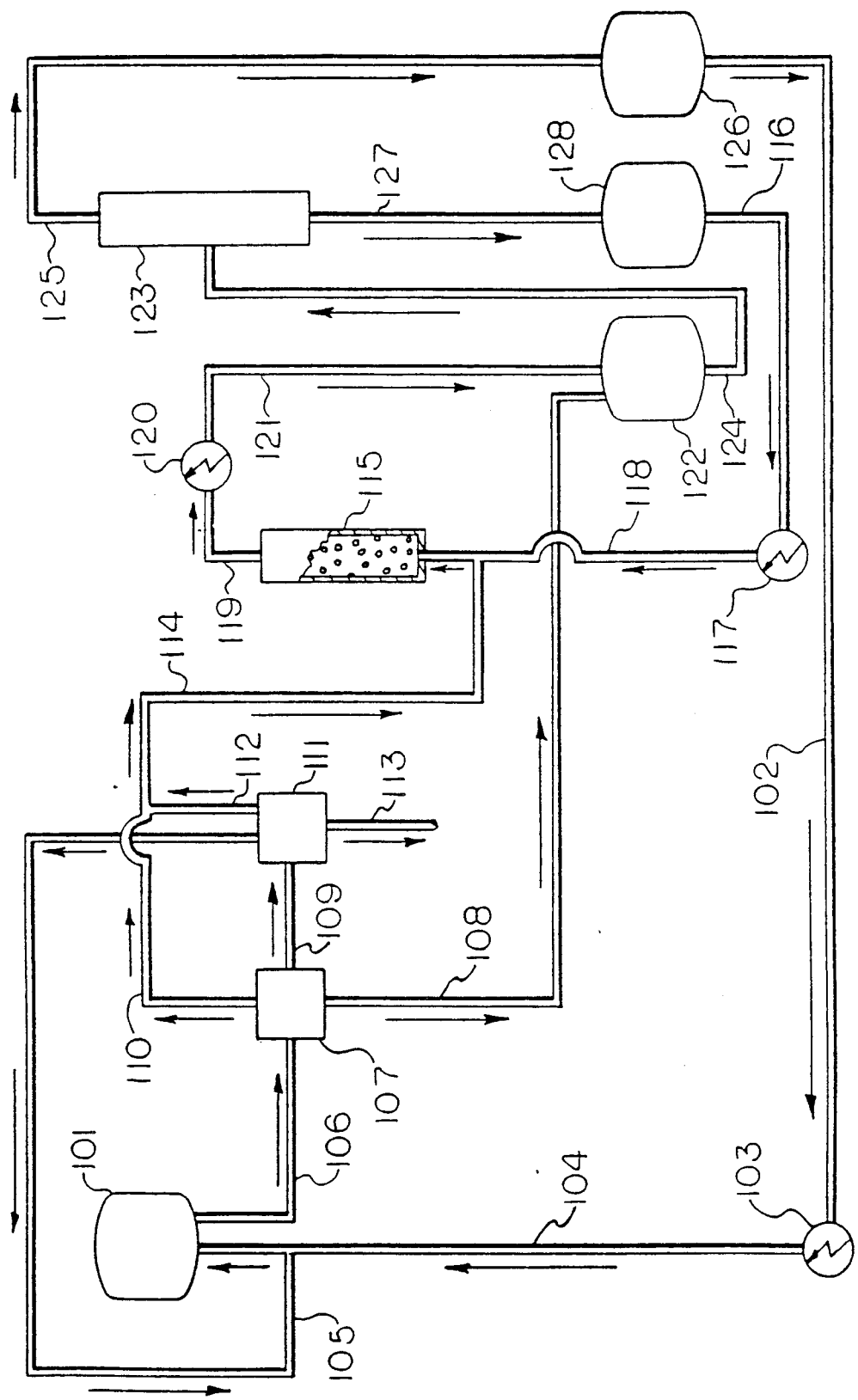
FIG. 2 is a schematic representation of a second embodiment of the instant invention in which process vent streams containing lower boiling silanes are contacted in the vapor phase with a solid catalyst and excess STC.

In FIG. 2, 101 is a CVD reactor, including an electrically heated semiconductor-grade silicon substrate. 102 is a TCS liquid feed stream. 103 is a vaporizer. 104 is the vapor TCS feed stream to the CVD reactor. 105 is the hydrogen gas feed stream to the CVD reactor. 106 is the vapor effluent stream from CVD reactor 101 which comprises unreacted TCS, hydrogen, by-product silanes, and by-product hydrogen chloride. 107 is a means for separating hydrogen and by-product hydrogen chloride from silanes. 108 is the collected liquid from means 107 comprising mainly TCS and STC. 109 is a gas stream comprising hydrogen and by-product hydrogen chloride. 110 is a process vent stream containing as a portion lower-boiling silanes. 111 is an activated carbon system for effecting separation of hydrogen from hydrogen chloride. 112 is a vapor stream comprising as a major portion hydrogen and as a minor portion lower-boiling silanes. 113 is an enriched hydrogen chloride stream. 114 is a combination of gas streams 110 and 112. 115 is the disproportionation reactor which is a bed of a solid catalyst. 116 is a liquid STC stream. 117 is a vaporizer. 118 is a vapor stream of STC fed to the reactor 115. 119 is the vapor effluent from reactor 115 reduced in content of $SiH_4$, MCS, and DCS and enriched in TCS. 120 is a condenser. 121 is a liquid stream comprising mainly TCS and STC. 122 is a tank for holding liquid that comprises mainly TCS and STC. 123 is a distillation column. 124 is the feed stream to distillation column 123. 125 is the recovered TCS stream. 126 is a TCS storage tank. 127 is the recovered STC stream. 128 is the STC storage tank.

DESCRIPTION OF THE INVENTION

In accordance with the instant invention there is provided a process for the deposition of semiconductor-grade silicon under conditions that will be delineated herein. What is described, therefore, is a process for the deposition of semiconductor-grade silicon by reductive chemical vapor decomposition of a precursor silane selected from a group consisting of chlorosilane, dichlorosilane, and trichlorosilane, the process comprising A. feeding the precursor silane as a vapor with hydrogen gas into a deposition vessel containing a heated substrate of semiconductor-grade silicon; B. forming and depositing semiconductor-grade silicon on the substrate; C. passing effluent gases from the deposition vessel to a means for separating a mixture enriched in lower-boiling silanes from the effluent gases; D. combining the mixture enriched in lower-boiling silanes with additional tetrachlorosilane, the proportions of the mixture and the additional tetrachlorosilane being controlled so that there is present in the combination less than about 1.0 mole of hydrogen bonded to silicon per mole of total silicon; E. passing the combination of the mixture enriched in lower-boiling silanes and the additional tetrachlorosilane through a bed of a solid catalyst, the catalyst being effective in disproportionation of hydrogen-containing silanes and chlorine-containing silanes and being essentially free of water; F. facilitating disproportionation of hydrogen-containing silanes and chlorine-containing silanes to produce a stream that is reduced in content of silane ($SiH_4$), chlorosilane, and dichlorosilane and increased in content of trichlorosilane; and G. isolating and separating the trichlorosilane.

The instant invention is based upon the discovery that by-product process streams containing lower-boiling, more difficult to contain silanes, such as silane ($SiH_4$), chlorosilane (MCS), and dichlorosilane (DCS) can be reacted with tetrachlorosilane (STC) to yield more readily recovered and readily contained trichlorosilane (TCS). The instant invention relates to a CVD process when it is especially important to maintain the purity integrity necessary to produce pure semiconductor silicon of the needed quality.

Steps (A) and (B), described above, are similar to apparatus and procedures described in the art of preparing semiconductor silicon via the CVD method, discussed supra.

In the preparation of semiconductor silicon via the CVD method, the pure semiconductor substrate is maintained at a temperature greater than about 900° C. At these decomposition/deposition conditions, only a portion of the precursor silane is reduced to deposit silicon. The hydrogen that reacts with the precursor silane generates as a by-product hydrogen chloride. The unreacted precursor silane generates by-product silanes which encompass the whole spectrum of silanes, from $SiH_4$, MCS, DCS, TCS, to STC. By-product hydrogen chloride can in turn react with the silanes, to form more highly chlorinated silanes. Thus, from the decomposition/deposition vessel is released an effluent gas stream comprising hydrogen, unreacted precursor silane, by-product hydrogen chloride, and by-product silanes.

This effluent gas stream of hydrogen and precursor silane and by-products may be passed to a means for separating the silanes from the hydrogen and the hydrogen chloride. This means for separating the silanes can be such a known method as condensation of the silanes. An example of this means for separating is a series of steps in which the vapor stream is first cooled to ambient temperature; the vapor stream would then be cooled to condense liquid consisting primarily of TCS and STC; the remaining vapors would be compressed and cooled with refrigeration to recover a liquid stream concentrated in the lower-boiling silanes. Processing of this liquid stream enriched in lower-boiling silanes can also result in one or more vapor streams. Thus, separation of the silane components of the effluent stream from the deposition vessel effects separating a mixture or mixtures enriched in lower-boiling silanes. Additionally, these stream or streams can be either a liquid or a vapor.

In one embodiment of the sequential separation of silanes from hydrogen and hydrogen chloride, the liquid stream from the last condensation step would be concentrated in the more highly hydrogen-containing, more difficult to contain silanes. As an example, for the preparation of pure semiconductor silicon from TCS via the CVD method, the composition (expressed in mole percent) of the silanes in the liquid from a final condensation step could be:

| MCS | DCS | TCS | STC |
|-----|-----|-----|-----|
| 1-3 | 20-35 | 60-70 | 4-5 |

The remaining effluent gases, freed of most of the silane components can be passed to a means for separating hydrogen from by-product hydrogen chloride. The means for separating hydrogen from by-product hydrogen chloride can be any known method in the art, as for example, treatment with activated carbon in which the hydrogen chloride is absorbed and separated. Another known means for hydrogen/hydrogen chloride separation is scrubbing of the gas stream with water and drying the subsequently isolated hydrogen. The isolated hydrogen stream may contain some of the lower-boiling silanes. The hydrogen so recovered is suitable for recycle to the CVD process. Reduction of the content of silanes is desirable before the recovered hydrogen is recycled to the CVD vessel. As an example, in the use of TCS as the feed to the CVD vessel the presence of any excessive levels of $SiH_4$, MCS, or DCS can have a detrimental effect upon the quality of the semiconductor silicon rod formed. In addition to the primary hydrogen and hydrogen chloride streams there are many other process streams that can be lost as venting vapors to water scrubbers and the like. As an example, in the use of activated carbon to separate hydrogen chloride from hydrogen, gases such as hydrogen used to regenerate the absorption beds can contain significant quantities of lower-boiling silanes which can be lost. An example of one such gas stream is a stream, described in the Examples infra, in which hydrogen comprises about 85 mole percent of the stream, the remainder being silanes; the composition of the silane portion, expressed in mole percent can be:

| $SiH_4$ | MCS | DCS | TCS | STC |
| --- | --- | --- | --- | --- |
| 25-60 | 5-10 | 10-25 | 15-35 | 5-15 |

Thus, separation of hydrogen from hydrogen chloride can effect means for separating a mixture enriched in lower-boiling silanes as a vapor.

It is understood that in the process of the instant invention several streams containing lower-boiling silanes may be combined or treated separately by the instant invention at the same time.

To recover a significant portion of the lower-boiling silanes that can be lost during the process of the CVD method or upon storage, the instant invention utilizes disproportionation of the $SiH_4$, MCS, and DCS content of process streams with excess STC to form TCS. It has been found that at temperatures lower than about 100° C., if the proportion of STC and other silanes is controlled so that there is present in the combination less than about 1.0 mole of hydrogen bonded to silicon per total mole of silicon, the content of $SiH_4$, MCS, and DCS will be reduced in favor of an increase in the TCS content. It is preferred that the level of hydrogen bonded to silicon per total mole of silicon in the combination be less than about 0.6 so that the $SiH_4$ and MCS are essentially eliminated.

Disproportionation is effected by passing a liquid or vapor stream through a bed of a solid catalyst which is effective in disproportionation of hydrogen-containing silanes and chlorine-containing silanes. Catalysts for disproportionation are numerous and widely known in the art. A preferred catalyst is selected from a group consisting of activated carbon, nitrogen-containing materials on solid substrates, and phosphorous-containing materials on solid substrates. The nitrogen-containing materials can be, for example, quaternary ammonium halides, tertiary amines, dialkylcyanamides, or nitriles. The phosphorous-containing materials can be, for example, quaternary phosphonium halides or phosphoramides. The solid substrates can be, for example, organic resins, silica, or activated carbon. A more preferred catalyst is a nitrogen compound on an organic resin, such as a polymeric styrene-divinylbenzene matrix.

The catalyst must be dried or "effectively free of water" prior to contact with silanes. Failure to dry the catalyst will result in reaction of water and silanes causing fouling of the catalyst and destruction of its usefulness as a catalyst. The catalyst can be dried with nitrogen gas. As an example of effective drying conditions, the catalyst can be effectively freed of water at ambient temperatures by passing nitrogen through a catalyst bed for 1-2 weeks. Drying time can be shortened by the application of heat and/or vacuum. The temperature to which the catalyst can be heated is limited by the temperature at which the catalyst will begin to degrade. As an example, a nitrogen-functional organic resin may be thermally deactivated by temperatures greater than about 150° C.

It is preferred that the catalyst be in a packed bed configuration.

Facilitating disproportionation of hydrogen-containing silanes and chlorine-containing silanes is mainly effected by the control of temperature within the catalyst bed and the time which the silane mixture is in contact with the catalyst. Temperature within the bed is dictated by the maximum temperature to which the catalyst can be heated without damage to catalytic activity and structural integrity and the pressure needed to maintain a reasonable pressure within the catalyst bed in the case of a liquid-phase system. It has been found that most catalysts are amenable to temperatures less than about 150° C. It has also been found that reasonable rate of disproportionation can be achieved at temperatures greater than about 10° C. in either the liquid phase or the vapor phase. It is preferred that the catalyst bed be maintained at a temperature in a range from about 10° to 80° C. It is understood that temperatures lower than about 10° C. can be utilized, however, with a lower rate of disproportionation. It is further understood that temperatures greater than about 80° C. can be utilized with higher rate of disproportionation, but with the potential for catalyst degradation and higher process pressures. Control of the temperature within the bed of solid catalyst can be effected by such known means as heating the feeds to the bed or heating the bed itself by jacketing the bed for external heating.

At the temperatures just described, the inventors believe that for a liquid-phase system, contact time greater than about 1 minute will effect a suitable rate of disproportionation. To more closely approach an equilibrium distribution of silanes, it is preferred that the contact time be in a range from about 5 to 20 minutes. Contact time greater than 20 minutes is not seen to have any benefit.

Likewise for a vapor-phase system at the temperatures just described, it is believed by the inventors that contact time greater than about 1 second will effect a suitable rate of disproportionation. To more closely approach an equilibrium distribution of silanes, it is preferred that the contact time be in a range from about 1 to 10 seconds. Contact time greater than 10 seconds is not seen to have any benefit.

Once disproportionation of the mixture of $SiH_4$, MCS, and DCS with STC to form additional TCS is effected, the TCS can be effectively isolated and separated by such known separation methods as distillation. The less volatile TCS can be effectively stored and contained without the losses experienced with the lower-boiling silanes. The TCS, so isolated and separated, can be recycled as feed for a CVD process utilizing TCS as the feed silane. The TCS can also be used as a feed to a disproportionation process to produce $SiH_4$, MCS, or DCS for CVD processes utilizing these silane materials as feed.

So that those skilled in the art may better understand and appreciate the instant invention, the following examples are presented. The following examples are presented to be illustrative of the instant invention and are not to be construed as limiting the instant invention as delineated in the claims.

EXAMPLE 1

The disproportionation of a stream containing volatile silicon-containing materials was evaluated in the vapor phase.

The solid catalyst utilized was DOWEX MWA-1, a tertiary amino-functional ion exchange resin. The resin is a polymeric styrene-divinylbenzene matrix. The DOWEX MWA-1 was manufactured by The Dow Chemical Company, Midland, Michigan. The solid catalyst was placed into a bed with a volume of about 0.3 cubic feet.

Bed temperature was controlled by heating the gas feed to the catalyst bed. Contact time within the bed was controlled by control of the gas flow to the bed.

The catalyst was dried in the bed by passing a steam-heated nitrogen stream through the catalyst for about 8 days.

The stream evaluated was a process vent stream that contained hydrogen, silane ($SiH_4$), chlorosilane (MCS), dichlorosilane (DCS), trichlorosilane (TCS), and tetrachlorosilane (STC). The process stream was about 15 mole percent silanes. Composition of the process vent stream and subsequent gas streams was determined by a combination of infrared spectroscopic and gas chromatographic analytical techniques. The process stream was sampled several times as the gas was fed to the bed of solid catalyst. These samples are designated as Samples A, B, and C, respectively. Table 1 is a summary of the results of respective analyses, on a hydrogen-free basis. In Table 1 the individual components are reported in mole percent; mole percent $SiH_4$, MCS, DCS, TCS, and STC, respectively, are denoted as "%$SiH_4$", "%MCS", "%DCS", "%TCS", and "%STC".

TABLE 1

| Sample | % $SiH_4$ | % MCS | % DCS | % TCS | % STC |
|---|---|---|---|---|---|
| A | 55.7 | 4.6 | 11.1 | 16.4 | 12.3 |
| B | 27.8 | 7.3 | 22.6 | 34.5 | 7.8 |
| C | 37.4 | 4.4 | 13.2 | 31.6 | 13.4 |

The process vent stream was mixed with STC vapor before being fed to the bed of solid catalyst. The catalyst bed was heated, and the system operated at a pressure of about 5 pounds per square inch, gauge (psig). Table 2 is a summary of the run conditions and the analyses of the process stream, on a hydrogen-free basis.

In Table 2, bed temperature is denoted as "°C"; total gas feed rate, in cubic feet per hour, is denoted as "CFH"; calculated residence time of the gas in the bed, in seconds, is denoted as "RT"; analyses of the feed stream is denoted as in Table 1; and the hydrogen content of the silicon-containing materials, expressed as moles of hydrogen bonded to silicon per mole of total silicon, is denoted as "SiH".

TABLE 2

| Sample | °C. | CFH | RT | % $SiH_4$ | % MCS | % DCS | % TCS | % STC | SiH |
|---|---|---|---|---|---|---|---|---|---|
| A | 57 | 128 | 8.8 | 8.4 | 1.8 | 3.6 | 2.5 | 83.7 | 0.49 |
| B | 14 | 238 | 4.8 | 4.1 | 2.1 | 5.3 | 5.1 | 83.5 | 0.38 |
| C | 29 | 220 | 5.1 | 6.4 | 1.1 | 3.6 | 5.4 | 83.4 | 0.42 |

Table 3 is a summary of the analyses of the silicon-containing materials leaving the bed of solid catalyst. The notation used in Table 1 is used in Table 3.

TABLE 3

| Sample | % $SiH_4$ | % MCS | % DCS | % TCS | % STC |
|---|---|---|---|---|---|
| A | 0 | 0.1 | 1.4 | 45.7 | 52.8 |
| B | 0 | 0.1 | 2.2 | 33.6 | 64.1 |
| C | 0 | 0.1 | 0.7 | 40.2 | 39.6 |

The above results demonstrate that a hydrogen gas stream containing lower-boiling silanes can be treated with a disproportionating catalyst with excess STC to reduce the content of $SiH_4$, MCS, and DCS in favor of additional TCS.

EXAMPLE 2

The disproportionation of a stream containing volatile silicon-containing materials was evaluated in the liquid phase.

Bed temperature was controlled by heating the liquid feed to the catalyst bed. Contact time within the bed was controlled by control of the liquid flow to the bed.

The solid catalyst utilized was again DOWEX MWA-1. The catalyst was dried in the bed with steam-heated nitrogen for about 2 weeks.

The stream evaluated was a liquid process stream that contained $SiH_4$, MCS, DCS, TCS, and STC. Composition of the process stream and subsequent process streams was determined by a gas chromatographic analytical technique. The process stream was sampled several times as the liquid was fed to the bed of solid catalyst. These samples are designated as Samples G, H, and J, respectively. Table 4 is a summary of the results of respective analyses, using the notation of Table 1.

TABLE 4

| Sample | % MCS | % DCS | % TCS | % STC |
|---|---|---|---|---|
| G | 2.0 | 32.3 | 62.6 | 3.2 |
| H | 2.7 | 34.4 | 59.1 | 3.8 |
| J | 1.2 | 23.7 | 70.8 | 4.3 |

The liquid process stream was mixed with additional STC before being fed to the bed of solid catalyst. The system was operated at a pressure of about 50-60 psig. Table 5 is a summary of the run conditions and the analyses of the feed to the bed of solid catalyst. In Table 5 the notation used in Table 2 is used with the exception that the residence time of the liquid in the bed is stated in minutes.

TABLE 5

| Sample | °C. | % RT MCS | % DCS | % TCS | % STC | SiH |
|---|---|---|---|---|---|---|
| G | 62 | 14.8 0.9 | 12.4 | 24.4 | 62.4 | 0.52 |
| H | 62 | 15.2 1.1 | 11.4 | 23.9 | 63.6 | 0.50 |
| J | 62 | 7.8 0.5 | 8.4 | 27.9 | 63.1 | 0.46 |

Table 6 is a summary of the analyses of the silicon-containing materials leaving the bed of solid catalyst. The notation used in Table 3 is used in Table 6.

TABLE 6

| Sample | % MCS | % DCS | % TCS | % STC |
|---|---|---|---|---|
| G | 0.05 | 3.2 | 50.0 | 46.8 |
| H | 0.05 | 3.1 | 48.6 | 48.3 |
| J | 0 | 2.7 | 45.2 | 52.1 |

The above results demonstrate that a liquid stream containing lower-boiling silanes can be treated with a disproportionating catalyst with excess STC to reduce the content of MCS, and DCS in favor of additional TCS.

What is claimed is:

1. A process for the deposition of semiconductor-grade silicon by reductive chemical vapor decomposition of a precursor silane selected from a group consisting of chlorosilane, dichlorosilane, and trichlorosilane, the process comprising
   A. feeding the precursor silane as a vapor with hydrogen gas into a deposition vessel containing a heated substrate of semiconductor-grade silicon;
   B. forming and depositing semiconductor-grade silicon on the substrate;
   C. passing effluent gases from the deposition vessel to a means for separating a mixture enriched in lower-boiling silanes from the effluent gases;
   D. combining the mixture enriched in lower-boiling silanes with additional tetrachlorosilane, the proportions of the mixture and the additional tetrachlorosilane being controlled so that there is present in the combination less than about 1.0 mole of hydrogen bonded to silicon per mole of total silicon;
   E. passing the combination of the mixture enriched in lower-boiling silanes and the additional tetrachlorosilane through a bed of a solid catalyst, the catalyst being effective in disproportionation of hydrogen-containing silanes and chlorine-containing silanes and being essentially free of water;
   F. facilitating disproportionation of hydrogen-containing silanes and chlorine-containing silanes to produce a stream that is reduced in content of silane ($SiH_4$), chlorosilane, and dichlorosilane and increased in content of trichlorosilane; and
   G. isolating and separating the trichlorosilane.

2. A process according to claim 1, wherein the proportions of the mixture enriched in lower-boiling silanes and the additional tetrachlorosilane content are controlled so that there is present in the combination less than about 0.6 mole of hydrogen bonded to silicon per mole of total silicon.

3. A process according to claim 1, wherein the catalyst is selected from a group consisting of activated carbon, nitrogen-containing materials on solid substrates, and phosphorous-containing materials on solid substrates.

4. A process according to claim 3, wherein the catalyst is a nitrogen-containing material on a solid substrate selected from a group consisting of an organic resin and silica.

5. A process according to claim 4, wherein the catalyst is selected from a group consisting of tertiary amino compounds and quaternary ammonium compounds; and the solid substrate is an organic resin.

6. A process according to claim 1, wherein the means for separating a mixture enriched in lower-boiling silanes comprises sequential cooling, condensation, and collection and separation of silane components of the effluent gases from the deposition vessel.

7. A process according to claim 1, wherein the means for separating a mixture enriched in lower-boiling silanes is separation of hydrogen from hydrogen chloride.

8. A process according to claim 6, wherein the mixture enriched in lower-boiling silanes is a liquid.

9. A process according to claim 6, wherein the mixture enriched in lower-boiling silanes is a vapor.

10. A process according to claim 7, wherein the mixture enriched in lower-boiling silanes is a vapor.

11. A process according to claim 1, wherein the mixture enriched in lower-boiling silanes and additional tetrachlorosilane are fed to the bed of solid catalyst as a liquid.

12. A process according to claim 1, wherein the mixture enriched in lower-boiling silanes and additional tetrachlorosilane are fed to the bed of solid catalyst as a vapor.

13. A process according to claim 1, wherein the bed of solid catalyst is maintained at a temperature of greater than about 10° C.

14. A process according to claim 13, wherein the bed of solid catalyst is maintained at a temperature in a range from about 10° to 80° C.

15. A process according to claim 11, wherein the mixture enriched in lower-boiling silanes and the additional tetrachlorosilane are in contact with the solid catalyst for greater than about 1 minute.

16. A process according to claim 15, wherein the mixture enriched in lower-boiling silanes and the additional tetrachlorosilane are in contact with the solid catalyst in a range from about 5 to 20 minutes.

17. A process according to claim 12, wherein the mixture enriched in lower-boiling silanes and the additional tetrachlorosilane are in contact with the solid catalyst for greater than about 1 second.

18. A process according to claim 17, wherein the mixture enriched in lower-boiling silanes and the tetrachlorosilane are in contact with the solid catalyst in a range from about 1 to 10 seconds.

19. A process according to claim 1, wherein isolating and separating trichlorosilane is effected by distillation.

20. A process according to claim 1, wherein the precursor silane is trichlorosilane; the catalyst is a tertiary amino compound on an organic resin; the proportions of the mixture enriched in lower-boiling silanes and the additional tetrachlorosilane content being controlled so that there is present in the combination less than about 0.6 mole hydrogen bonded to silicon per mole of total silicon; the mixture enriched in lower-boiling silanes and the tetrachlorosilane are in contact with the solid catalyst at a temperature in a range from about 10° to 80° C.; and the trichlorosilane is isolated and separated by distillation.

21. A process according to claim 20, wherein the combination of the mixture enriched in lower-boiling silanes and the tetrachlorosilane are passed to the bed of solid catalyst as a liquid and the combination is in contact with the solid catalyst in a range from about 5 to 20 minutes.

22. A process according to claim 20, wherein the combination of the mixture enriched in lower-boiling silanes and the tetrachlorosilane are passed to the bed of solid catalyst as a vapor and the combination is in contact with the solid catalyst in a range from about 1 to 10 seconds.

23. A process according to claim 20, wherein the isolated and separated trichlorosilane is recycled as the precursor silane to a reductive chemical vapor decomposition process.

24. A process according to claim 1, wherein the isolated and separated trichlorosilane is fed to a disproportionation process to generate silanes selected from a group consisting of silane, chlorosilane, and dichlorosilane.

* * * * *